(12) United States Patent
Moon et al.

(10) Patent No.: US 10,320,036 B2
(45) Date of Patent: Jun. 11, 2019

(54) VOLTAGE SENSING ASSEMBLY AND BATTERY MODULE INCLUDING THE SAME

(71) Applicant: LG CHEM, LTD., Seoul (KR)

(72) Inventors: Jung Oh Moon, Daejeon (KR); Dal Mo Kang, Daejeon (KR); Jong Woon Choi, Daejeon (KR); Jun Yeob Seong, Daejeon (KR); Byung O Kong, Daejeon (KR); Youngsop Eom, Daejeon (KR)

(73) Assignee: LG CHEM, LTD., Seoul (KR)

( * ) Notice: Subject to any disclaimer, the term of this patent is extended or adjusted under 35 U.S.C. 154(b) by 227 days.

(21) Appl. No.: 15/023,271

(22) PCT Filed: Sep. 26, 2014

(86) PCT No.: PCT/KR2014/008994
§ 371 (c)(1),
(2) Date: Mar. 18, 2016

(87) PCT Pub. No.: WO2015/046934
PCT Pub. Date: Apr. 2, 2015

(65) Prior Publication Data
US 2016/0315356 A1     Oct. 27, 2016

(30) Foreign Application Priority Data
Sep. 26, 2013   (KR) .................. 10-2013-0114664

(51) Int. Cl.
*H01M 10/42*     (2006.01)
*H01M 10/48*     (2006.01)
(Continued)

(52) U.S. Cl.
CPC ...... *H01M 10/4257* (2013.01); *G01R 31/364* (2019.01); *G01R 31/3835* (2019.01);
(Continued)

(58) Field of Classification Search
None
See application file for complete search history.

(56) References Cited

U.S. PATENT DOCUMENTS

2006/0260120 A1\* 11/2006 Chen ................. H01M 2/30
                                                 29/623.4
2008/0199765 A1   8/2008 Yoon et al.
(Continued)

FOREIGN PATENT DOCUMENTS

CN   101395739 A   3/2009
CN   102822687 A   12/2012
(Continued)

OTHER PUBLICATIONS

International Search Report for PCT/KR2014/008994 dated Nov. 28, 2014.

*Primary Examiner* — Yoshitoshi Takeuchi
(74) *Attorney, Agent, or Firm* — Birch, Stewart, Kolasch & Birch, LLP

(57) ABSTRACT

Disclosed herein is a voltage sensing assembly including sensing bus bars connected to series connection portions of battery cells for sensing the voltage of the battery cells, a printed circuit board (PCB), to the upper part of which the sensing bus bars are and to the lower part of which a connector is coupled, the connector mounted on the PCB, an insulative mounting member including a receiving part having a shape corresponding to the shape of the PCB such that the PCB is mounted in the receiving part, the receiving part being provided at one side thereof with openings, through which the sensing bus bars extend, and an insulation sheet attached to the front surface of the PCB.

15 Claims, 2 Drawing Sheets

(51) Int. Cl.
  *G01R 31/364* (2019.01)
  *G01R 31/3835* (2019.01)
  *H01M 2/02* (2006.01)
  *H01M 2/10* (2006.01)
  *H01M 2/20* (2006.01)
  *H01M 2/22* (2006.01)
  *H01M 10/0525* (2010.01)

(52) U.S. Cl.
  CPC ......... *H01M 2/0202* (2013.01); *H01M 2/026* (2013.01); *H01M 2/0237* (2013.01); *H01M 2/0262* (2013.01); *H01M 2/0287* (2013.01); *H01M 2/1022* (2013.01); *H01M 2/204* (2013.01); *H01M 2/22* (2013.01); *H01M 10/0525* (2013.01); *H01M 10/425* (2013.01); *H01M 10/48* (2013.01); *H01M 10/482* (2013.01); *H01M 2/1077* (2013.01); *H01M 2/206* (2013.01); *H01M 2010/4271* (2013.01); *H01M 2010/4278* (2013.01); *H01M 2220/10* (2013.01); *H01M 2220/20* (2013.01); *H01M 2220/30* (2013.01)

(56) References Cited

U.S. PATENT DOCUMENTS

| | | |
|---|---|---|
| 2009/0214936 A1 | 8/2009 | Yang et al. |
| 2010/0247979 A1 | 9/2010 | Ha et al. |
| 2011/0059342 A1 | 3/2011 | Lee et al. |
| 2012/0315522 A1 | 12/2012 | Shin et al. |
| 2012/0328908 A1* | 12/2012 | Han ................... H01M 2/1061 429/7 |
| 2013/0202947 A1 | 8/2013 | Joye et al. |
| 2013/0288530 A1* | 10/2013 | Zhao ..................... H01M 2/206 439/627 |
| 2013/0323574 A1* | 12/2013 | Tsunaki ................ H01M 2/206 429/158 |
| 2013/0330584 A1 | 12/2013 | Lee et al. |

FOREIGN PATENT DOCUMENTS

| | | |
|---|---|---|
| CN | 102842695 A | 12/2012 |
| JP | 2011-165628 A | 8/2011 |
| KR | 10-2007-0043501 A | 4/2007 |
| KR | 10-2007-0114409 A | 12/2007 |
| KR | 10-2008-0025430 A | 3/2008 |
| KR | 10-2010-0109857 A | 10/2011 |
| KR | 10-2011-0112896 A | 10/2011 |
| KR | 10-2012-0126893 A | 11/2012 |
| WO | WO 2013/090649 A1 | 6/2013 |

* cited by examiner

[FIG. 1]
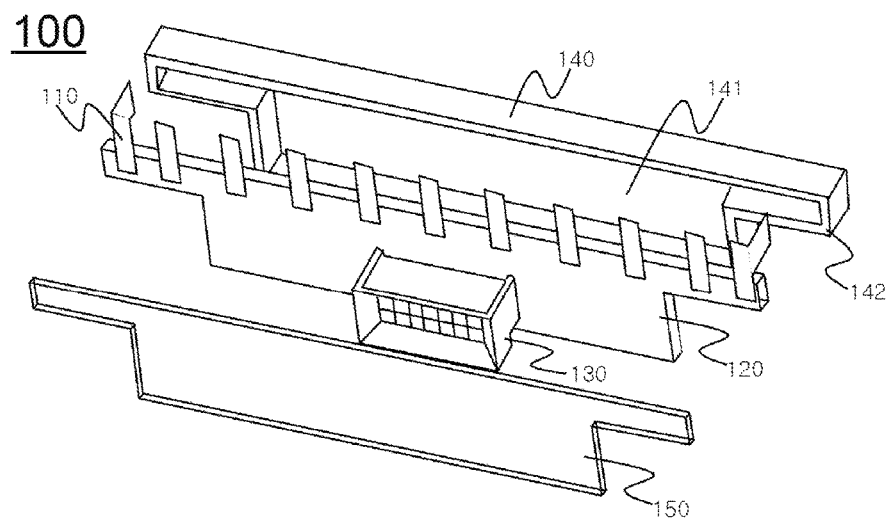
[FIG. 2]
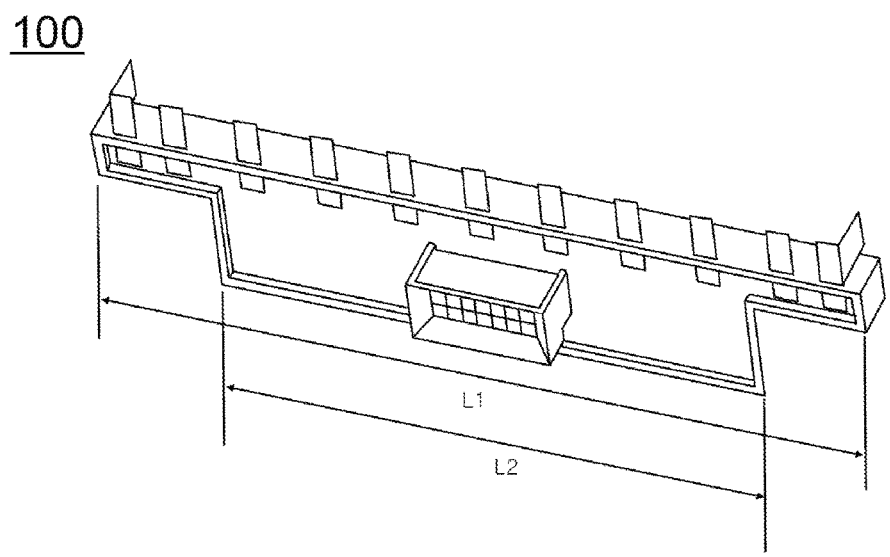

[FIG. 3]
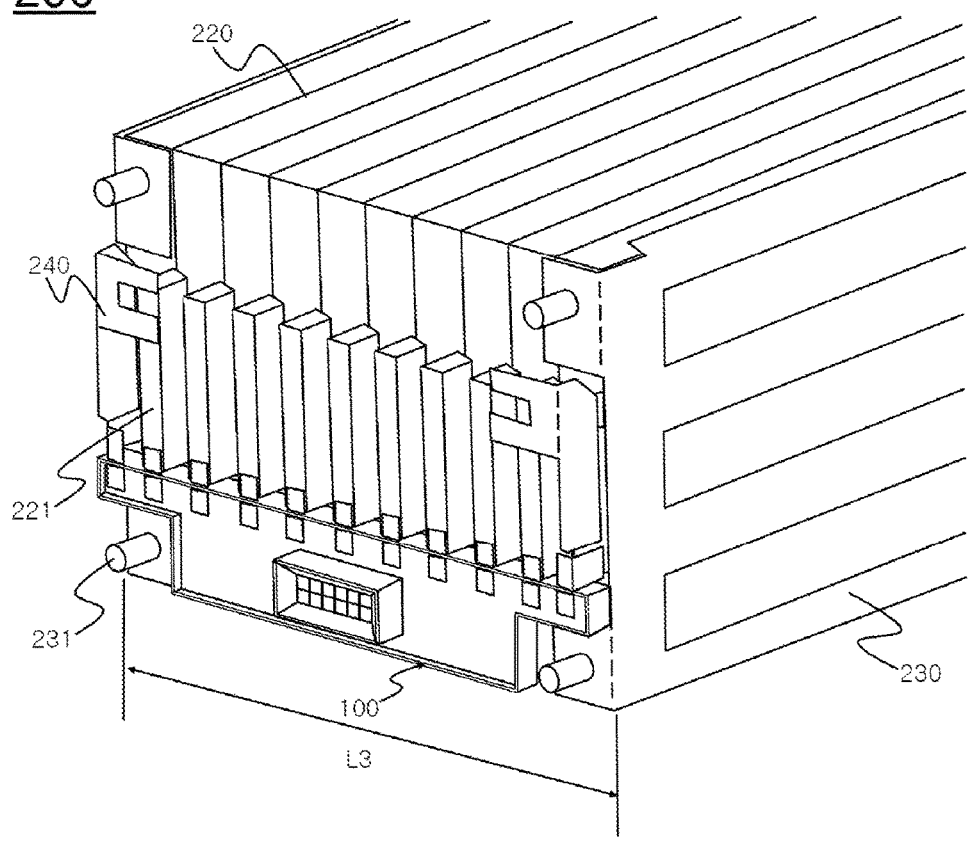

VOLTAGE SENSING ASSEMBLY AND BATTERY MODULE INCLUDING THE SAME

TECHNICAL FIELD

The present invention relates to a voltage sensing assembly and a battery module including the same.

BACKGROUND ART

In recent years, a secondary battery, which can be repeatedly charged and discharged, has been widely used as an energy source for wireless mobile devices. In addition, the secondary battery has attracted considerable attention as a power source for electric vehicles (EV), hybrid electric vehicles (HEV), and plug-in hybrid electric vehicles (Plug-In HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, use a battery module or a battery pack having a plurality of battery cells electrically connected to each other because high output and large capacity are necessary for the middle or large-sized devices. For such a secondary battery, a plurality of battery cells may be connected in series to each other in order to provide output and capacity required by an apparatus or device in which the secondary battery is mounted.

Meanwhile, a lithium secondary battery exhibits excellent electrical properties; however, the lithium secondary battery has low safety. For example, in the event of abnormal operations, such as overcharge, overdischarge, exposure to high temperature, and electrical short circuit, of the lithium secondary battery, decomposition of active materials and an electrolyte, which are components of the battery, may occur, with the result that heat and gas are generated, and the high-temperature and high-pressure conditions caused by generation of the heat and the gas accelerate the above-mentioned decomposition. Ultimately, the lithium secondary battery may ignite or explode.

The safety-related problem of the lithium secondary battery is even more serious for a middle or large-sized battery module or battery pack having a multi-cell structure. Since a plurality of battery cells is used in the multi-cell battery module or battery pack, abnormal operation of some of the battery cells may cause abnormal operation of the other battery cells, with the result that the battery pack may ignite or explode, which may lead to a large-scale accident.

For this reason, a conventional middle or large-sized battery module or battery pack is provided with a sensing device for measuring the voltage and temperature of battery cells and a battery management system (BMS) for controlling the battery cells based on the measured values.

However, a middle or large-sized battery module or battery pack including such a safety system has a problem in that the capacity of the battery per unit volume is reduced due to the increased space in the battery module or battery pack that is occupied by the safety system.

DISCLOSURE

Technical Problem

The present invention has been made to solve the above problems and other technical problems that have yet to be resolved.

Specifically, it is an object of the present invention to provide a voltage sensing assembly having a compact structure and a battery module including the same.

Technical Solution

In accordance with one aspect of the present invention, the above and other objects can be accomplished by the provision of a voltage sensing assembly mounted to a battery module including a plurality of battery cells connected in series to each other for measuring the voltage of the battery cells, the voltage sensing assembly including sensing bus bars connected to series connection portions of the battery cells for sensing the voltage of the battery cells, a printed circuit board (PCB), to the upper part of which the sensing bus bars are coupled in a state in which the sensing bus bars are arranged at equal intervals and to the lower part of which a connector is coupled, the connector mounted on the PCB for transmitting the sensed voltage to a battery management system (BMS), an insulative mounting member including a receiving part having a shape corresponding to the shape of the PCB such that the PCB is mounted in the receiving part, the receiving part being provided at one side thereof with openings, through which the sensing bus bars extend, and an insulation sheet having a shape corresponding to the shape of the PCB, the insulation sheet being provided with an opening having a shape corresponding to the shape of the connector, the insulation sheet being attached to the front surface of the PCB.

That is, the voltage sensing assembly according to the present invention includes a printed circuit board PCB, to which sensing bus bars are coupled in a state in which the sensing bus bars are arranged at equal intervals, and an insulative mounting member, in which the PCB is received. Consequently, it is possible to manufacture a battery module or battery pack having a compact structure.

In a concrete example, the sensing bus bars may be coupled to the PCB using surface mounting technology (SMT). In a case in which the SMT is used, it is possible to reduce the shape and the size of each of the sensing bus bars, to simplify an assembly process, and to reduce assembly time.

The sensing bus bars may be connected to the series connection portions of the battery cells by welding. Since the sensing bus bars are connected to the series connection portions of the battery cells by welding, the connection between the sensing bus bars and the battery cells is maintained, even when external impact is applied to the battery module, whereby it is possible to measure the voltage of each of the battery cells and to check whether the battery module is operating normally.

The welding may be laser welding, spot welding, or ultrasonic welding.

The PCB may be formed to have a plate shape. Specifically, the PCB may be configured such that the length of the upper end of the PCB is equivalent to the width of the battery module and such that the length of the lower end of the PCB is equivalent to 60% to 80% the length of the upper end of the PCB.

The insulative mounting member may be mounted to the battery module in a state in which the insulative mounting member is in tight contact with electrode terminals of the battery cells at one side of each of the battery cells, which constitute the battery module, while the PCB is received in the insulative mounting member. Consequently, no additional space for mounting the voltage sensing assembly to the battery module is needed, whereby it is possible to manufacture a battery module having a compact structure.

In accordance with another aspect of the present invention, there is provided a battery module including the voltage sensing assembly with the above-stated construction, a battery cell stack including a plurality of battery cells, the battery cells being sequentially stacked, a pair of end plates mounted to outermost sides of the battery cell stack, external input and output terminals connected to electrode terminals of outermost battery cells of the battery cell stack, and a BMS mounted to one surface of the battery cell stack.

For example, each of the battery cells may be configured to have a structure in which an electrode assembly is mounted in a battery case made of a laminate sheet including a metal layer and a resin layer, and the outer edge of the battery case is sealed.

In addition, each of the battery cells may be mounted in a battery cartridge configured to have a frame structure. Specifically, the cartridge may include a pair of plate-shaped frames configured to fix the outer edge of a corresponding one of the battery cells in a state in which at least one side surface of the battery cell is open.

The battery cells are not particularly restricted so long as the battery cells can provide high voltage and high current when a battery module or a battery pack is configured using the battery cells. For example, each of the battery cells may be a lithium secondary battery.

In accordance with another aspect of the present invention, there is provided a battery pack including one or more battery modules with the above-stated construction.

In accordance with a further aspect of the present invention, there is provided a device including the battery pack as a power source. Specifically, the device may be selected from a group consisting of a mobile phone, a portable computer, a smart phone, a smart pad, a netbook computer, a light electronic vehicle (LEV), an electric vehicle, a hybrid electric vehicle, a plug-in hybrid electric vehicle, and a power storage apparatus.

The structure and manufacturing method of the device are well known in the art to which the present invention pertains and, therefore, a detailed description thereof will be omitted.

BRIEF DESCRIPTION OF DRAWINGS

The above and other objects, features and other advantages of the present invention will be more clearly understood from the following detailed description taken in conjunction with the accompanying drawings, in which:

FIG. 1 is a perspective view showing a voltage sensing assembly according to an embodiment of the present invention;

FIG. 2 is an exploded view of the voltage sensing assembly shown in FIG. 1; and

FIG. 3 is a perspective view showing a battery module according to an embodiment of the present invention.

BEST MODE

Now, exemplary embodiments of the present invention will be described in detail with reference to the accompanying drawings. It should be noted, however, that the scope of the present invention is not limited by the illustrated embodiments.

FIG. 1 is a perspective view showing a voltage sensing assembly according to an embodiment of the present invention, and FIG. 2 is an exploded view of the voltage sensing assembly shown in FIG. 1.

Referring to FIGS. 1 and 2, a voltage sensing assembly 100 includes sensing bus bars 110, a printed circuit board (PCB) 120, a connector 130, an insulative mounting member 140, and an insulation sheet 150.

The sensing bus bars 110 are coupled to the upper part of the PCB 120 in a state in which the sensing bus bars 110 are arranged at equal intervals, and the connector 130 is coupled to the lower part of the PCB 120. The sensing bus bars 110 are coupled to the PCB 120 using surface mounting technology, thereby simplifying an assembly process.

The insulative mounting member 140 includes a receiving part 141 having a shape corresponding to the shape of the PCB 120, and a sidewall 141 is formed along the outer edge of the receiving part 141 in a protruding fashion. In addition, the receiving part 141 is provided at one side thereof with openings (not shown), each of which has a size corresponding to the size of a corresponding one of the sensing bus bars and which are arranged at intervals corresponding to the intervals at which the sensing bus bars are arranged.

The insulation sheet 150 is attached to the exposed surface of the PCB 120 in a state in which the PCB 120 is received in the insulative mounting member 140. The insulation sheet 150 is provided with an opening (not shown), which has a shape corresponding to the shape of the connector 130. Consequently, the insulation sheet 150 insulates the entirety of the PCB 120, excluding the connector 130, from the outside.

FIG. 3 is a perspective view showing a battery module according to an embodiment of the present invention.

Referring to FIG. 3 together with FIGS. 1 and 2, a battery module 200 includes a voltage sensing assembly 100, a battery cell stack 220, a pair of end plates 230, external input and output terminals 240, and a battery management system (BMS) (not shown).

The voltage sensing assembly 100 is mounted to the battery module 200 in a state in which the voltage sensing assembly 100 is in tight contact with electrode terminals 221 of the battery cell stack 220 at one side of the battery cell stack 220.

A length L1 of the upper end of the voltage sensing assembly 100 is equivalent to a width L3 of the battery module 200, and a length L2 of the lower end of the voltage sensing assembly 100 is equivalent to 70% the length L1 of the upper end of the voltage sensing assembly 100 such that the lower end of the voltage sensing assembly 100 cannot contact fastening protrusions 231, which are mounted to the respective end plates 230.

Sensing bus bars 110 of the voltage sensing assembly 100 are connected to the electrode terminals 221 of the battery cell stack 220 by welding.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, a voltage sensing assembly according to the present invention includes a printed circuit board (PCB), to which sensing bus bars are coupled in a state in which the sensing bus bars are arranged at equal intervals, and an insulative mounting member, in which the PCB is received. Consequently, it is possible to manufacture a battery module or battery pack having a compact structure.

The invention claimed is:

1. A voltage sensing assembly configured to be mounted to a battery module comprising a plurality of battery cells connected in series to each other for measuring voltage of the battery cells, the voltage sensing assembly comprising:
   sensing bus bars configured to be connected to series connection portions of the battery cells for sensing the voltage of the battery cells;
   a printed circuit board (PCB), to an upper part of which the sensing bus bars are coupled in a state in which the sensing bus bars are arranged at equal intervals and to a lower part of which a connector is coupled;
   the connector mounted on the PCB for transmitting the sensed voltage to a battery management system (BMS);
   an insulative mounting member having a cross-sectional shape of an interior surface thereof that is substantially equal in size to a cross-sectional shape of the PCB when viewed from a front view of the insulative mounting member and the PCB, wherein the PCB is mounted in the insulative mounting member, and wherein the insulative mounting member is provided at a top surface thereof with openings through which the sensing bus bars extend; and
   an insulation sheet, separate from the insulative mounting member, having a cross-sectional shape substantially the same as the cross-sectional shape of the PCB, the insulation sheet being provided with an opening having a shape substantially the same as a shape of the connector, and the insulation sheet being attached to a front surface of the PCB.

2. The voltage sensing assembly according to claim 1, wherein the sensing bus bars are coupled to the PCB using surface mounting technology (SMT).

3. The voltage sensing assembly according to claim 1, wherein the sensing bus bars are connected to the series connection portions of the battery cells by welding.

4. The voltage sensing assembly according to claim 1, wherein the PCB is formed to have a plate shape, and the voltage sensing assembly is configured such that a length of an upper end of the voltage sensing assembly is equivalent to a width of the battery module.

5. The voltage sensing assembly according to claim 4, wherein the voltage sensing assembly is configured such that a length of a lower end of the voltage sensing assembly is equivalent to 60% to 80% the length of the upper end of the voltage sensing assembly.

6. The voltage sensing assembly according to claim 1, wherein the insulative mounting member is mounted to the battery module in a state in which the insulative mounting member is in tight contact with electrode terminals of the battery cells at one side of each of the battery cells.

7. The voltage sensing assembly according to claim 1, wherein the insulative mounting member comprises a sidewall formed along an outer edge thereof and provided at a rear surface thereof.

8. A battery module comprising:
   a voltage sensing assembly according to claim 1;
   a battery cell stack comprising a plurality of battery cells, the battery cells being sequentially stacked;
   a pair of end plates mounted to outermost sides of the battery cell stack;
   external input and output terminals connected to electrode terminals of outermost battery cells of the battery cell stack; and
   a BMS mounted to one surface of the battery cell stack.

9. The battery module according to claim 8, wherein each of the battery cells is configured to have a structure in which an electrode assembly is mounted in a battery case made of a laminate sheet comprising a metal layer and a resin layer, and an outer edge of the battery case is sealed.

10. The battery module according to claim 8, wherein each of the battery cells is mounted in a battery cartridge configured to have a frame structure.

11. The battery module according to claim 10, wherein the cartridge comprises a pair of plate-shaped frames configured to fix an outer edge of a corresponding one of the battery cells in a state in which at least one side surface of the battery cell is open.

12. The battery module according to claim 8, wherein each of the battery cells is a lithium secondary battery.

13. A battery pack comprising one or more battery modules according to claim 8.

14. A device comprising a battery pack according to claim 13 as a power source.

15. The device according to claim 14, wherein the device is selected from a group consisting of a mobile phone, a portable computer, a smart phone, a smart pad, a netbook computer, a light electronic vehicle (LEV), an electric vehicle, a hybrid electric vehicle, a plug-in hybrid electric vehicle, and a power storage apparatus.

* * * * *